(12) United States Patent
Withers et al.

(10) Patent No.: US 11,694,910 B2
(45) Date of Patent: Jul. 4, 2023

(54) BRUSH WITH NON-CONSTANT NODULE DENSITY

(71) Applicant: Illinois Tool Works Inc., Glenview, IL (US)

(72) Inventors: Bradley Scott Withers, El Dorado Hills, CA (US); Erik Scott Nelson, Granite Bay, CA (US); Corey Alan Hughes, Sacramento, CA (US); Brent Allan Best, Rocklin, CA (US)

(73) Assignee: Illinois Tool Works Inc., Glenview, IL (US)

( * ) Notice: Subject to any disclaimer, the term of this patent is extended or adjusted under 35 U.S.C. 154(b) by 97 days.

(21) Appl. No.: 16/996,224

(22) Filed: Aug. 18, 2020

(65) Prior Publication Data
US 2021/0074556 A1 Mar. 11, 2021

Related U.S. Application Data

(60) Provisional application No. 62/898,534, filed on Sep. 10, 2019.

(51) Int. Cl.
| | |
|---|---|
| *A46B 9/00* | (2006.01) |
| *H01L 21/67* | (2006.01) |
| *A46B 9/02* | (2006.01) |
| *A46B 13/04* | (2006.01) |
| *A46B 13/02* | (2006.01) |

(52) U.S. Cl.
CPC ........ *H01L 21/67046* (2013.01); *A46B 9/005* (2013.01); *A46B 9/025* (2013.01); *A46B 13/04* (2013.01); *A46B 13/02* (2013.01); *A46B 2200/30* (2013.01)

(58) Field of Classification Search
CPC ... H01L 21/67046; A46B 9/005; A46B 9/025; A46B 13/04
See application file for complete search history.

(56) References Cited

U.S. PATENT DOCUMENTS

| | | | |
|---|---|---|---|
| 10,271,636 B2 | 4/2019 | Withers | |
| 2003/0032292 A1 | 2/2003 | Noguchi | |
| 2010/0212100 A1 | 8/2010 | Ku | |
| 2013/0048018 A1 | 2/2013 | Wargo | |
| 2013/0133692 A1* | 5/2013 | Withers | A46D 1/0253 15/207.2 |
| 2014/0230170 A1* | 8/2014 | Patel | H01L 21/67046 15/88.4 |
| 2021/0112961 A1 | 4/2021 | Ku | |

FOREIGN PATENT DOCUMENTS

| | | |
|---|---|---|
| WO | 2010125663 A1 | 11/2010 |
| WO | 2010125663 A1 | 11/2010 |

OTHER PUBLICATIONS

International Search Report, dated Jan. 12, 2021, in International application No. PCT/US2020/048789, filed on Aug. 31, 2020 (28 pages).

* cited by examiner

*Primary Examiner* — Shay Karls
(74) *Attorney, Agent, or Firm* — McAndrews, Held & Malloy, Ltd.

(57) ABSTRACT

Provided is a disclosure for a brush for cleaning a surface, where the brush comprises a center core and cleaning material around the center core. Modules are found on the cleaning material, where nodule density on the cleaning material varies. Accordingly, a first nodule density of a first region of the cleaning material is different than a second nodule density of a second region of the cleaning material.

20 Claims, 8 Drawing Sheets

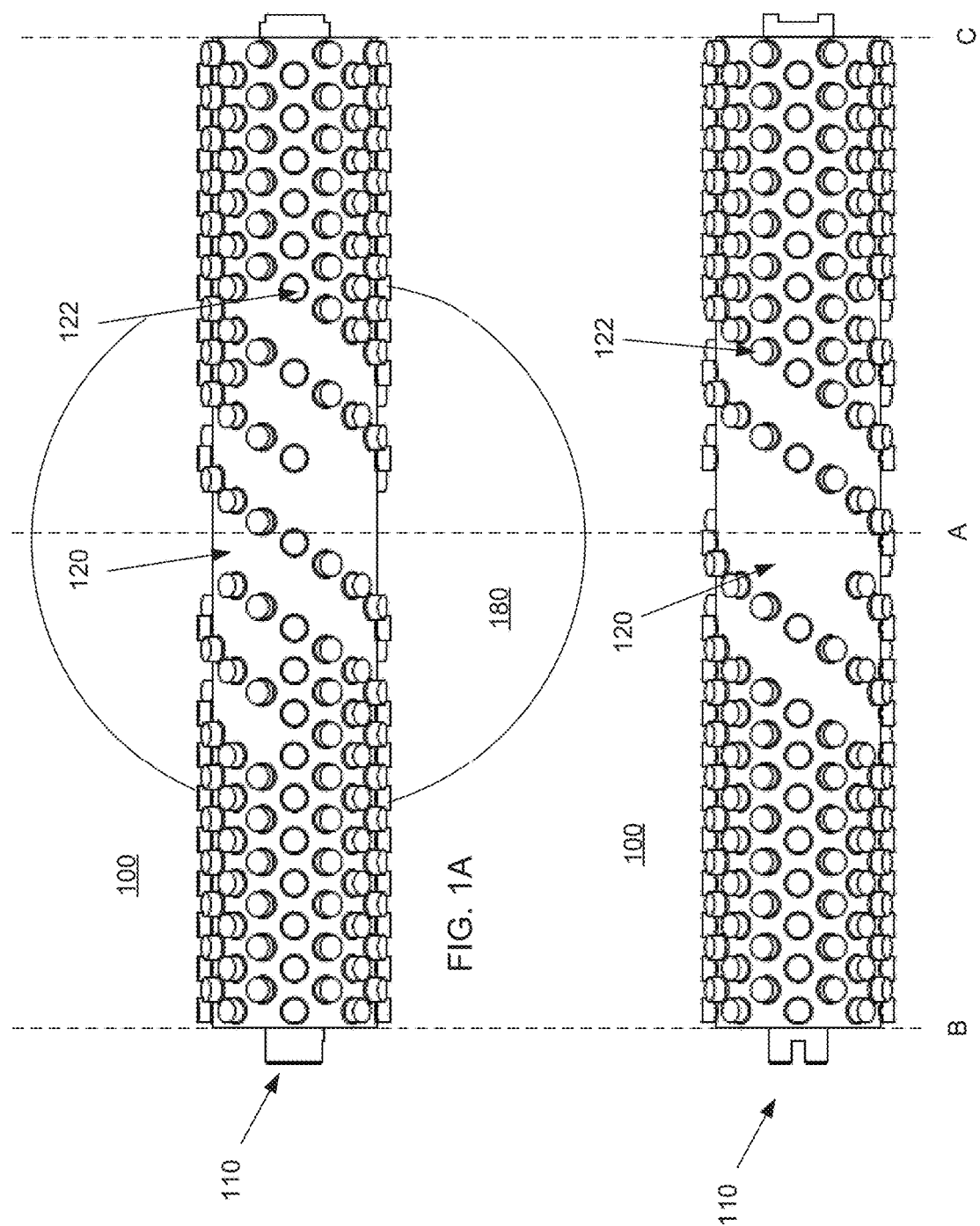

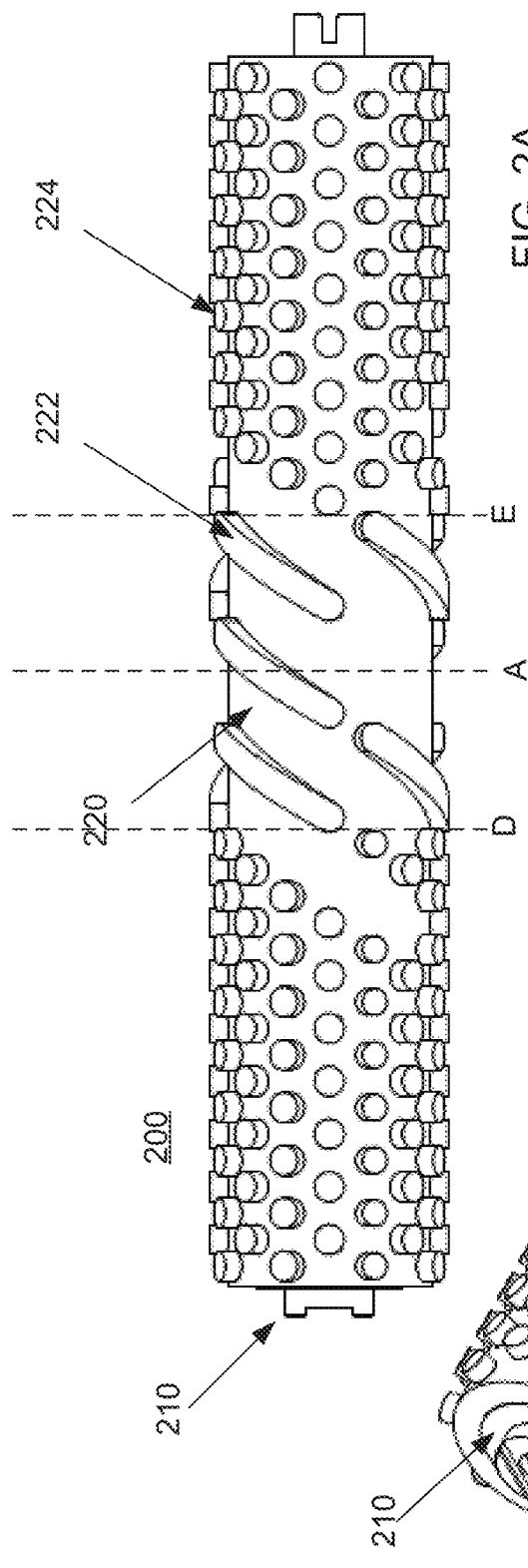
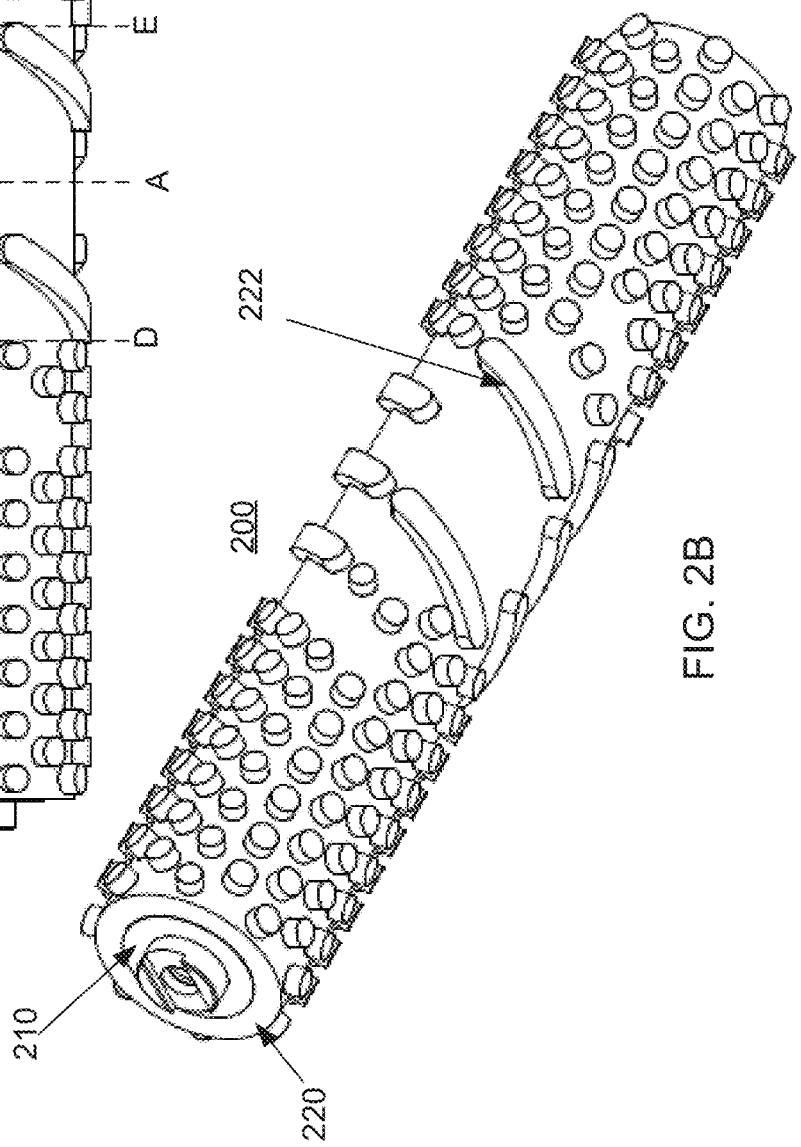
FIG. 2A
FIG. 2B

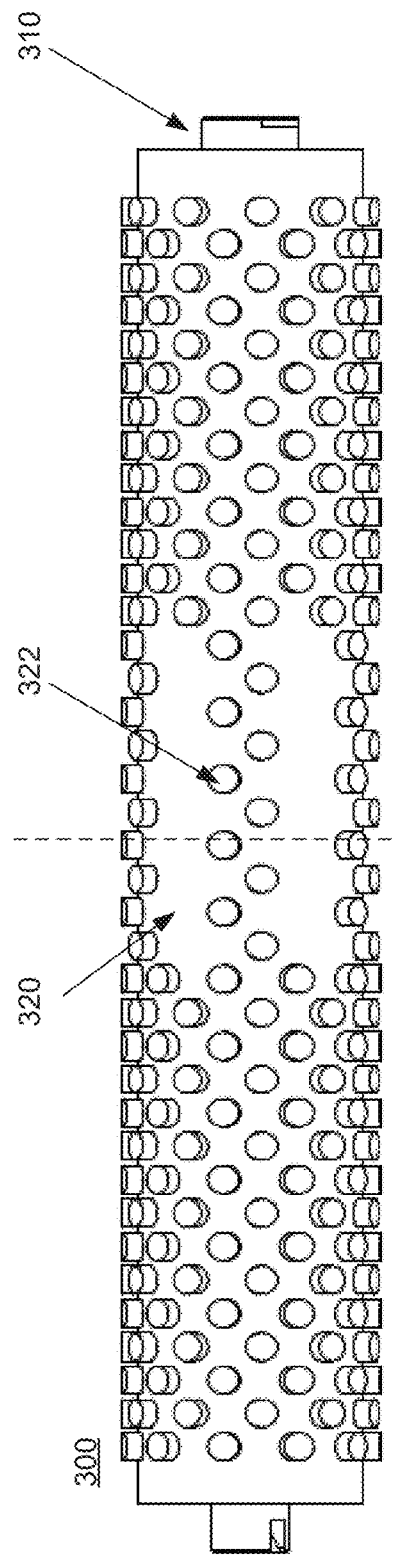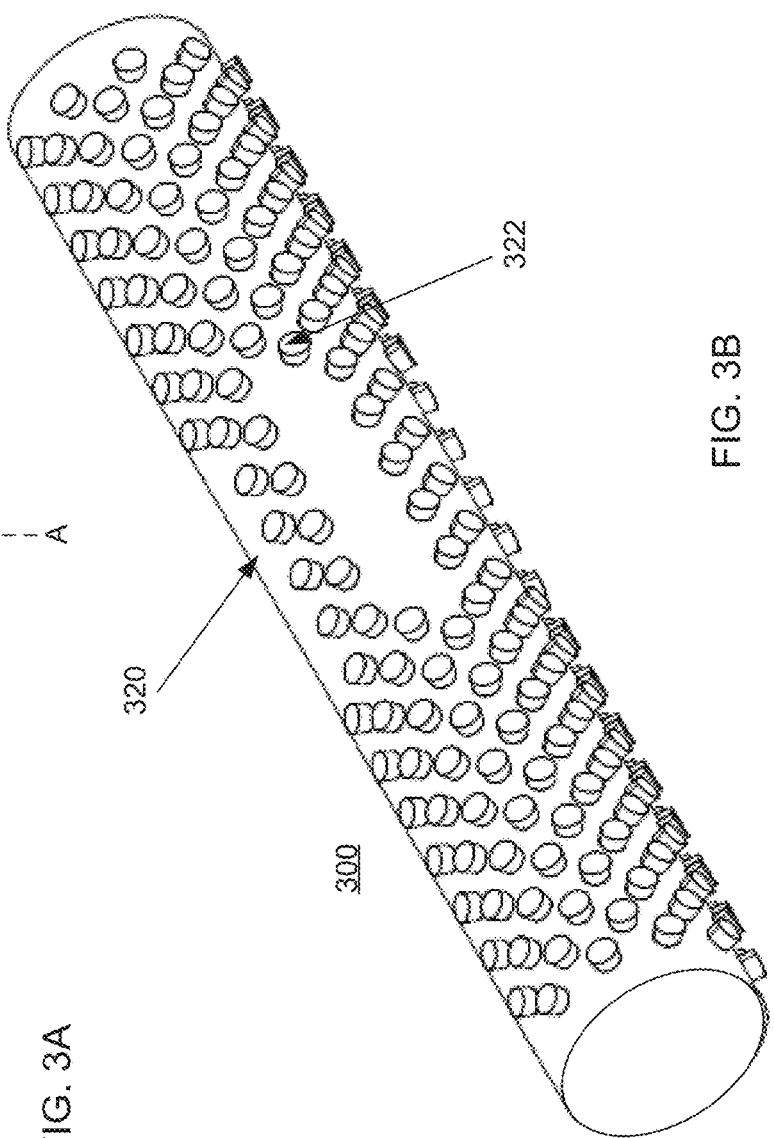
FIG. 3A
FIG. 3B

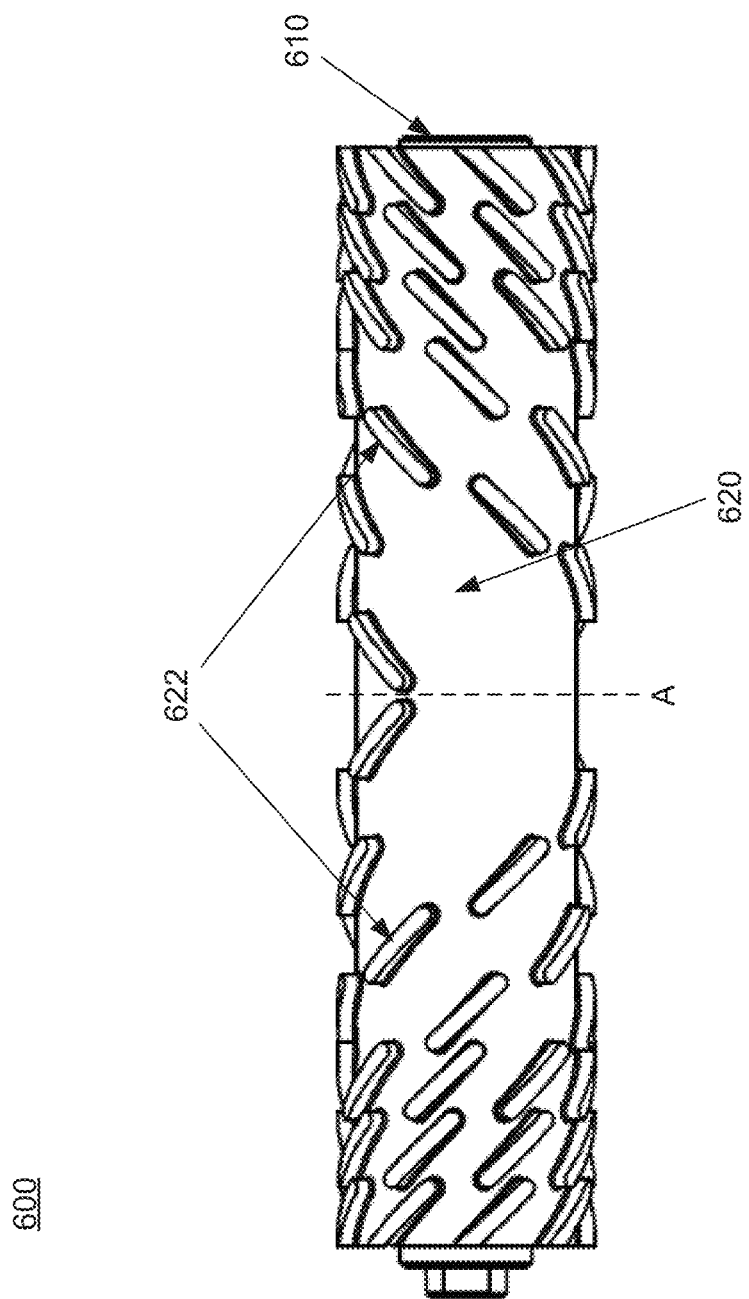

BRUSH WITH NON-CONSTANT NODULE DENSITY

CROSS-REFERENCE TO RELATED APPLICATIONS/INCORPORATION BY REFERENCE

This patent application makes reference to, claims priority to, and claims benefit from provisional patent application 62/898,534, filed on Sep. 10, 2019, and titled "Apparatus for a Brush With Non-constant Nodule Density," which is hereby incorporated herein by reference in its entirety.

BACKGROUND

The present disclosure relates to brushes for cleaning a surface, and more particularly, to a brush with non-constant nodule density.

In the semiconductor manufacturing industry and other industries, brushes are used to remove contaminants from surfaces, such as from surfaces of semiconductor wafers. Conventional brushes comprise nodules used to clean the surfaces where the brushes have a constant density of nodules.

Limitations and disadvantages of conventional approaches to conditioning and use of a brush will become apparent to one of skill in the art, through comparison of such approaches with some aspects of the present method and system set forth in the remainder of this disclosure with reference to the drawings.

SUMMARY

Methods and apparatus are provided for a brush with non-constant nodule density, substantially as illustrated by and described in connection with at least one of the figures, as set forth more completely in the claims.

BRIEF DESCRIPTION OF THE DRAWINGS

These and/or other aspects will become apparent and more readily appreciated from the following description of the exemplary embodiments, taken in conjunction with the accompanying drawings.

FIGS. 1A and 1B illustrate a first example brush with a non-constant nodule density, in accordance with aspects of this disclosure.

FIGS. 2A and 2B illustrate a second example brush with a non-constant nodule density, in accordance with aspects of this disclosure.

FIGS. 3A and 3B illustrate a third example brush with a non-constant nodule density, in accordance with aspects of this disclosure.

FIG. 6 illustrates a sixth example brush with a non-constant nodule density, in accordance with aspects of this disclosure.

The figures are not necessarily to scale. Where appropriate, similar or identical reference numbers are used to refer to similar or identical components.

DETAILED DESCRIPTION

Figure 4:
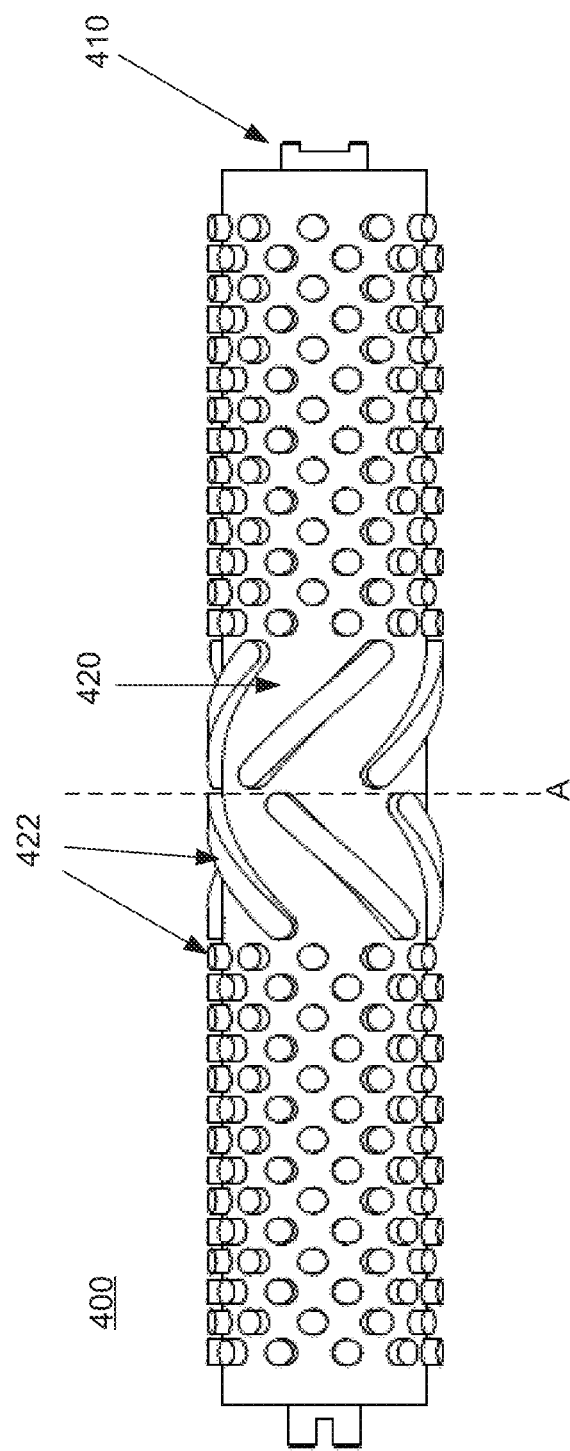
FIG. 4 illustrates a fourth example brush with a non-constant nodule density, in accordance with aspects of this disclosure.

Various applications and processes may benefit from physical cleaning of an object's surface. For example, in semiconductor manufacturing, a semiconductor wafer may be cleaned to remove potentially destructive contaminants during one or more stages of fabricating electronic circuits on the wafer. The cleaning process involves, for example, nodules on a cleaning surface of a brush coming in contact with the surface to be cleaned, where the surface to be cleaned may be, for example, a face of a semiconductor wafer.

While it should be understood that various aspects of the disclosure may be used for different applications, example references in this disclosure will be made to cleaning a surface of a semiconductor wafer.

During a manufacturing process for a semiconductor wafer, a large number of contaminants may be found on the semiconductor wafer surface in the form of, for example, organic and/or inorganic particles. These contaminants will typically result in device failure and poor wafer yields. Moreover, with each new semiconductor technology node, the critical size of the defects on the semiconductor wafer and the tolerable number of defects on the semiconductor wafer becomes smaller.

The semiconductor industry may use post-chemical mechanical planarization (pCMP) cleaning in the manufacture of semiconductor devices where brushes such as, for example, polyvinyl acetate (PVAc) brushes, may be used in combination with application-specific cleaning agents and/or chemicals to remove contaminants from the semiconductor wafer surface.

FIGS. 1A and 1B show two different views of an example brush for cleaning surfaces such as, for example, semiconductor wafer surfaces. There is shown in FIG. 1A a brush 100 comprising a center core 110 (which may also be referred to as a "mandrel") and a cleaning material 120. The cleaning material 120 may be, for example, PVAc and comprises nodules 122. As can be seen, there are fewer nodules per unit area in a region near a longitudinal center A of the brush 100 than regions near longitudinal ends B and C of the brush 100. That is, the nodule density is lower near the longitudinal center A of the brush 100 than near longitudinal ends B and C of the brush. FIG. 1B is the same brush as shown in FIG. 1A except the brush 100 of FIG. 1B is rotated 90° about its longitudinal axis with respect to FIG. 1A.

Although not shown, there may be one or more conduits in, for example, the center core 110 for delivery of fluids used in cleaning such as deionized water and various chemicals. The fluids are delivered via openings in the center core 110 to the cleaning material 120, where the fluids can come in contact with a surface of the object to be cleaned. For example, the surface to be cleaned may be that of a semiconductor wafer 180.

As shown in FIGS. 1A and 1B, the nodules may form a helical (spiral) pattern. This pattern may allow contaminants, loose particles, the cleaning fluids, etc. to be channeled to one or both ends B and C of the brush 100. Additionally, the lower nodule density in the center of the brush 100 allows for less contact to a center portion of, for example, the semiconductor wafer 180. This is described further with respect to FIG. 8.

The nodules 122 may be formed as a part of the cleaning material 120 or may be attached to the cleaning material 120. For example, the cleaning material 120 may be formed with the nodules 122 via molds. The nodules 122 may also be formed separately and attached to the cleaning material 120 using, for example, adhesives.

A cross-section of the brush 100 without the nodules 122 may be substantially circular. The cleaning material 120 may be attached to the center core 110 by, for example, friction fit or by using one or more adhesives. Additionally, as can be seen, the helical pattern of the nodules 122 can move the cleaning fluids, contaminants, etc., towards the longitudinal end B and/or C to keep the fluids, contaminants, etc. from re-contaminating, for example, the semiconductor wafer 180 that is being cleaned or the brush 100 that is used to clean the semiconductor wafer 180. A cleaning process is described in more detail with respect to FIG. 8.

FIGS. 2A and 2B illustrate a brush 200 that is similar to the brush 100. The brush 200 comprises a center core 210 and cleaning material 220 that comprises nodules 222, 224. It may be noted that some nodules 222 near the longitudinal center A are elongated while the nodules 224 are round. However, it can be seen that the nodules 222, 224 still form a helical pattern. Accordingly, various examples of the disclosure may have nodules that are different shapes that are conducive to the patterns on the brush. For example, a nodule shape may be round, rectangular, diamond, trapezoidal, chevron, etc. The nodules in a region of a brush need not all be of the same shape.

As can be seen in FIGS. 2A and 2B, the region D-E around the longitudinal center A may have the elongated nodules 222 and regions outside the region D-E may have the round nodules 224. Other examples of the disclosure may use shapes other than those shown in this disclosure, and another region may comprise nodules with different shapes.

While it can be seen that the nodule 222 is physically bigger than the nodule 224, a nodule may also be described as being larger when its surface area that touches, for example, the semiconductor 180 for cleaning is larger than a surface area of another nodule.

FIGS. 3A and 3B illustrate a brush 300 that is similar to the brush 100. The brush 300 comprises a center core 310 and cleaning material 320 that comprises nodules 322. The nodules 322 are in a grid pattern where the nodule density varies over the brush 300. Accordingly, various examples of the disclosure may have nodules that are different shapes that are conducive to the patterns on the brush. Additionally, the nodules in a region of a brush need not all be of the same shape.

FIG. 4 illustrates a brush 400 that is similar to the brush 100. The brush 400 comprises a center core 410 and cleaning material 420 that comprises nodules 422. The nodules 422 may be formed such that the pattern on the left side of the longitudinal center A is substantially symmetric to the pattern on the right side of the longitudinal center A.

Figure 5:
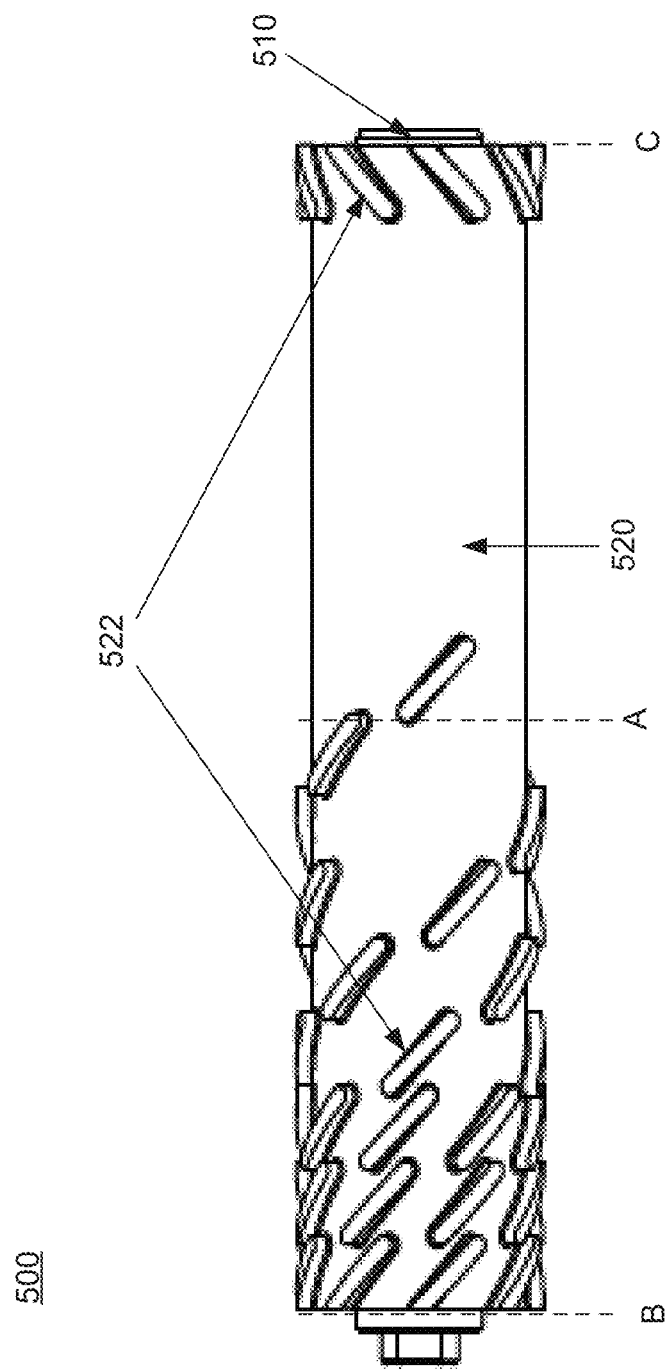
FIG. 5 illustrates a fifth example brush with a non-constant nodule density, in accordance with aspects of this disclosure.

FIG. 5 illustrates a brush 500 that is similar to the brush 100. The brush 500 comprises a center core 510 and cleaning material 520 that comprises nodules 522 that are elongated. The elongated nodules 522 are in a helical pattern where the nodule density varies over the brush 500. In the example brush 500 shown in FIG. 5, there are nodules 522 on the left side of the brush 500, however, the right side of the brush 500 is substantially empty of nodules except near the longitudinal center A and near the end C. While the nodules 522 in this example are only shown near the longitudinal center A and near the end C of the right side of the brush 500, various examples of the disclosure may comprise nodules at various regions on the right side of the brush 500. Various examples of the disclosure may also have nodules 522 that are different shapes on the brush 500. That is, the nodules 522 in a region of the brush 500 may be of different shapes.

FIG. 6 illustrates a brush 600 that is similar to the brush 100. The brush 600 comprises a center core 610 and cleaning material 620 that comprises nodules 622 that are elongated. As can be seen, the left side of the brush 100 may be substantially symmetric with the right side of the brush 600. The elongated nodules 622 on each side of the brush 600 are in a helical pattern with varying nodule density. While the nodules 622 in the brush 600 are shown as being elongated, various examples of the disclosure may have nodules that are different shapes as described above. That is, various nodules 622 in a region of the brush 600 may be different shapes.

Accordingly, an example brush may use nodules that may be, for example, similar in shape to the nodules 122/224/322 where the nodules 122/224/322 are placed in a similar pattern as in FIG. 6. However, as the size of a nodule 122/224/322 may differ from a size of the nodule 622, the distance between two individual nodules 122/224/322 may be different than the distance between two individual nodules 622. Accordingly, it can be seen that while different shapes of nodules may be used for a given nodule pattern, the distance between the nodules (placement) may depend on the type of nodules used.

Figure 7B:
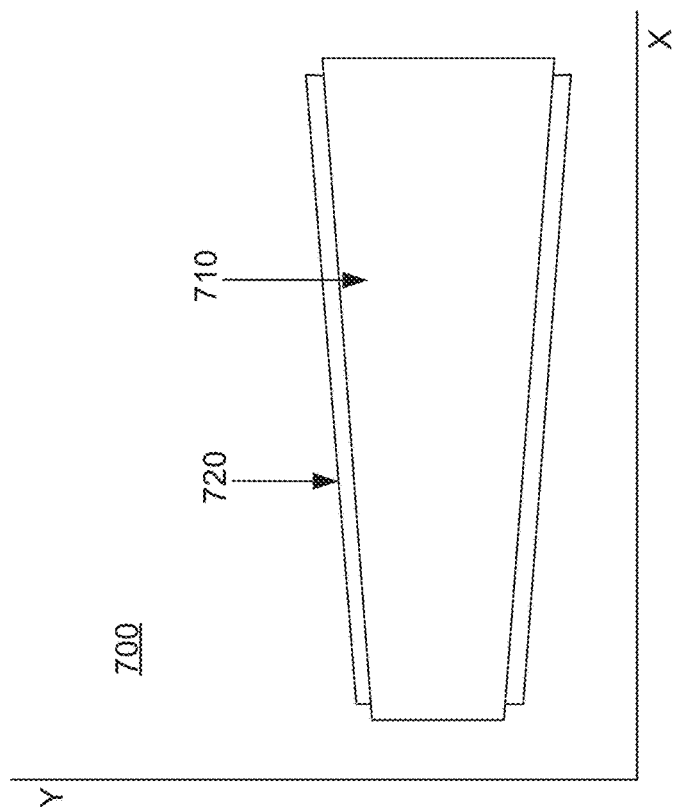
FIGS. 7A and 7B illustrates an example brush with a non-constant diameter along its longitudinal axis, in accordance with aspects of this disclosure.
Figure 7A:
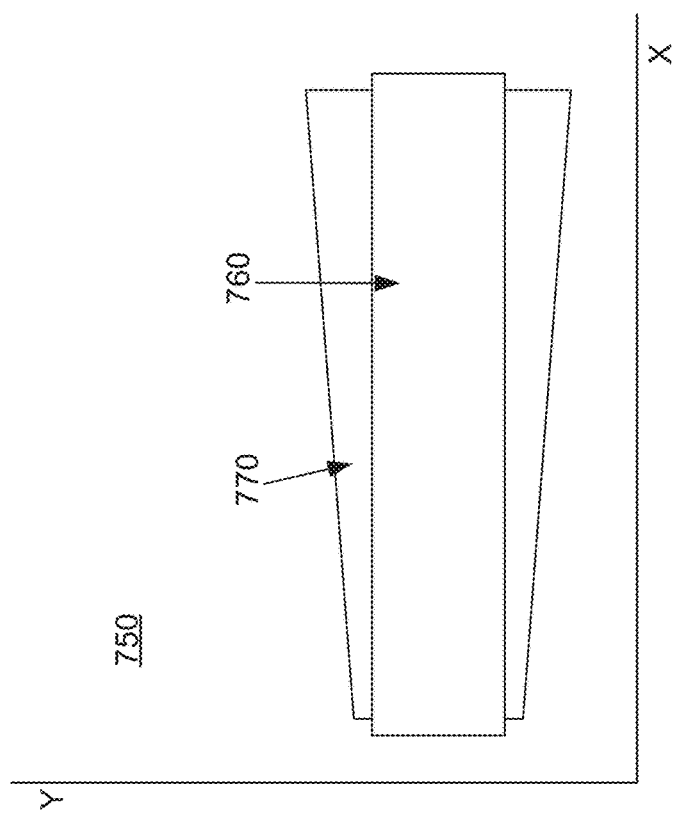

FIGS. 7A and 7B illustrate brush 700 that does not have a uniform diameter along the longitudinal axis X. As can be seen, the diameter increases along the X-axis from left to right. In FIG. 7A, the center core 710 increases in diameter while the cleaning material 720 has a substantially constant thickness. In FIG. 7B, the center core 760 has a constant diameter while the cleaning material 770 has increasing thickness from left to right along the longitudinal axis X. The cleaning material 720, 770 may comprise nodules at least as illustrated in FIGS. 1-6.

While specific examples are shown, other examples may have different shapes where the diameter may change non-linearly along the longitudinal axis X. For example, the diameter of the brush 700/750, the center core 710/760, and/or the cleaning material 720/770 may be slightly smaller in a center region near the longitudinal center A than near the longitudinal ends Y and Z. Another example may be where the diameter is slightly larger in the center region near the longitudinal center A than near the longitudinal ends Y and Z.

Still other examples may have a center core 710 of FIG. 7A with the cleaning material 770 of FIG. 7B. In some cases, a brush formed in this way may have a substantially constant outer diameter. Also, depending on the alignment of the center core and the cleaning material, and varying levels of change in diameter of the center core and/or of the cleaning material the brush may present a different slope from left to right.

It may also be noted that the nodule density and/or pattern in the example FIGS. 1A-4 and 6 show that the nodule density is substantially symmetric about the longitudinal center A. However, it should be noted that various examples of the disclosure need not be limited so. That is, as shown in FIG. 5, the nodule density need not be substantially symmetric about the longitudinal center A.

Figure 8:
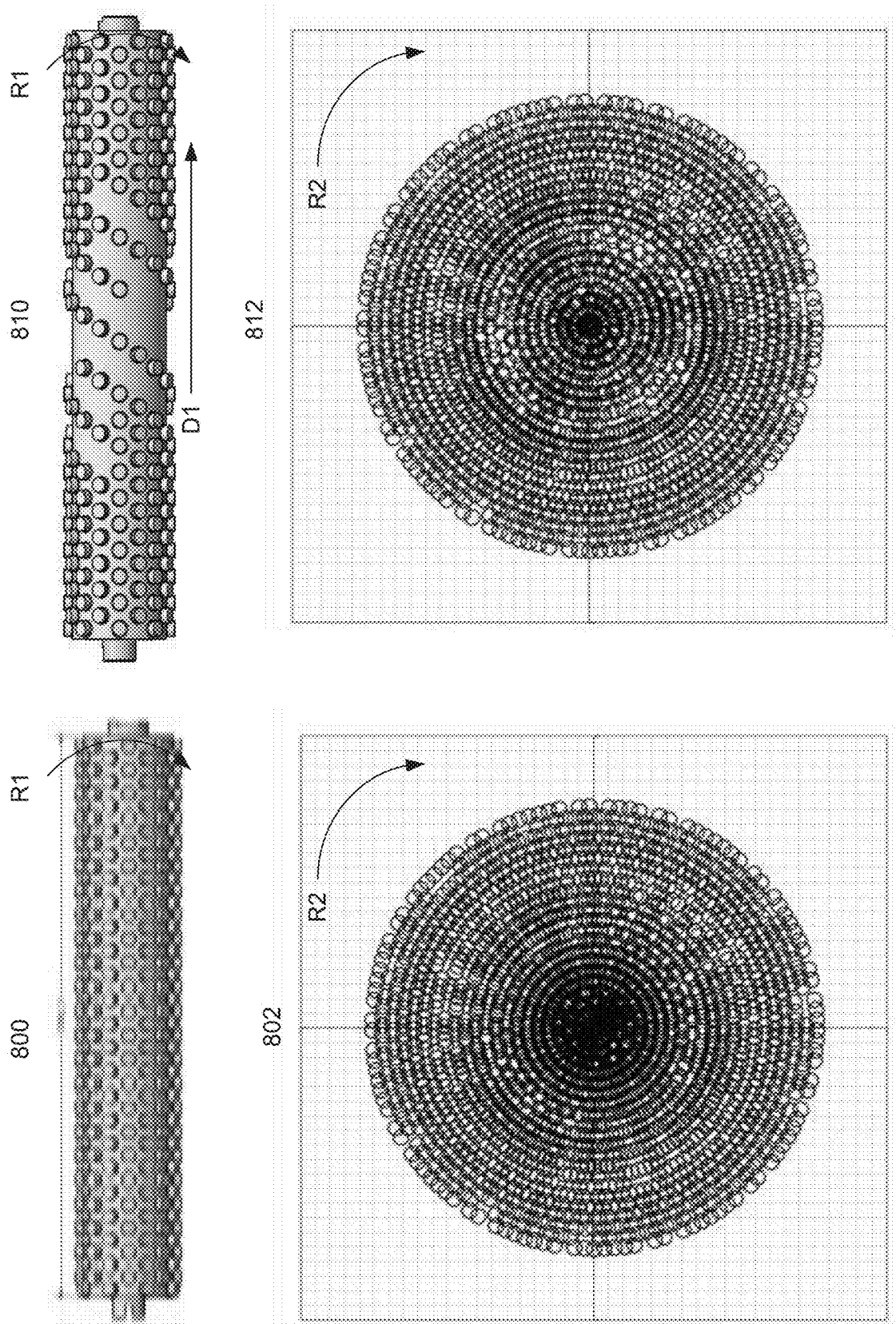
FIG. 8 illustrates graphs comparing contact during cleaning by a conventional brush and by a non-constant nodule brush, in accordance with aspects of this disclosure.

FIG. 8 illustrates a graph 802 of contact made with a test surface by a conventional brush 800 versus a graph 812 of contact made with a test surface by brush 810 with a non-constant (biased) nodule layout of the brush 100 in FIGS. 1A and 1B. Graph 802 shows a darker region near the center of the test surface than away from the center of the test surface indicating more contact in the center region than in the outer region. On the other hand, graph 812 provides a more constant amount of contact for all regions of the test surface.

When a cleaning process is taking place, the brush 800, 810 may be rotated about its longitudinal axis in a direction R1. The test surface, which may be, for example, similar to a semiconductor wafer 180, may be spun in the example direction R2 shown. Contact made by the various nodules of a brush (e.g., nodules 122 of the brush 100) with the test surface (semiconductor wafer 180) may result in cleaning the test surface. The deionized water (DIW) and the cleaning fluid(s), as well as any contaminants and loose particles from the brush 810, are then moved along a direction D1 due to the pattern of the nodules 122.

Accordingly, having different amount of contact implies different levels of cleaning. Furthermore, having additional contact in the center may indicate that some damage may have been done to the central region due to the additional contact. That is, if the outer regions have sufficient contact for acceptable cleaning, the central region may have been damaged due to over-cleaning. Alternatively, if the central region has sufficient contact for acceptable cleaning, the outer regions may not be acceptably cleaned.

However, in looking at the graph 812, it can be seen that most of the central region has substantially the same amount of contact as the outer regions. Accordingly, the entirety of the semiconductor wafer 180 may be cleaned much more consistently and, therefore, have less damaged regions for the semiconductor wafer 180.

In addition to reducing contact in a central region of a surface being cleaned due to the non-constant nodule density as illustrated in the FIGS. 1A-6, the non-constant nodule density can also aid in reducing an amount of deionized water (DIW) near the center of the surface being cleaned. The reduced amount of DIW with respect to cleaning fluid may aid in better cleaning a semiconductor wafer while lessening the risk of wafer damage. Accordingly, various examples of the disclosure may have a biased (reduced) nodule layout that can be in any form such as, for example, a helical pattern, a grid pattern or any other pattern conducive to moving fluids and/or particles to at least one edge Y or Z of a brush when in operation, etc. The biased region may have a contact area due to the nodules that may be, for example, 10-90% less than an unbiased region of the brush. Furthermore, a central region around the longitudinal center A may be any width from 10-90% of a brush's longitudinal length. Furthermore, the biased nodule region may form continuous or discontinuous helical pattern(s) of any length along the brush, where a helical pattern can be of any width and pitch, and the width/pitch may vary for different parts of the helical pattern(s).

Accordingly, it can be seen that the present disclosure provides for a brush for cleaning a surface, where the brush comprises a center core and cleaning material around the center core. The center core comprises nodules where a first nodule density of a first region of the cleaning material is different than a second nodule density of a second region of the cleaning material. For example, there may be fewer nodules per unit area, or a smaller number of contact area on the nodules per unit area, in a first region than in a second region.

The nodule density may be smaller, for example, at a longitudinal center of the brush than at a longitudinal end of the brush. Some examples of the disclosure may have the nodules form a substantially helical pattern on the cleaning material. Other examples of the disclosure may have the nodules form a substantially grid pattern on the cleaning material. Various examples of the disclosure may have the nodule patterns be symmetric about a longitudinal center of the brush.

Some examples of the disclosure may form the nodules as part of the cleaning material. An example may be, for example, using a mold to form the cleaning material with the nodules. Some examples of the disclosure may form the nodules separately and then attach them to the cleaning material with adhesives, for example. Or the nodules may be on a sleeve that is placed over the cleaning material.

In an example of the disclosure, there may be one or more nodules that has a different shape than another set of nodules. For example, first nodules may be cylindrical shape while a second nodules may be elongated. Accordingly, the nodules may be any of various shapes.

A brush may also be shaped such that one end of the brush has a different diameter than the other end of the brush, or two different cross-sections of the brush may have different diameters. The cross-section of the brush may be generally circular when not taking into account the nodules.

In an example of the disclosure, the cleaning material may be friction fit over the center core, or the cleaning material may be coupled to the center core with an adhesive.

At least some of the nodules may be placed in a pattern to move cleaning fluid toward a longitudinal end of the brush, where the cleaning fluid is provided to one or both of the brush and the surface at least during a cleaning process of the surface of, for example, the semiconductor wafer.

Additionally, it can be seen that the disclosure also provides for a brush for cleaning a surface, where the brush comprises a center core and cleaning material about the center core. The cleaning material comprises nodules where first nodules at a first region of the brush have a first shape and second nodules at a second region of the brush have a second shape. One or both of the first region and the second region may comprise first nodules having the first shape and the second nodules having the second shape. The first region may be, for example, closer to a longitudinal center of the brush than the second region. In some examples of the disclosure, the first shape may be larger than the second shape in surface area, and more specifically, in the surface area that touches the object to be cleaned. The first nodules and/or the second nodules may be placed in a pattern to move cleaning fluid toward a longitudinal end of the brush, where the cleaning fluid is provided to one or both of the brush and the surface at least during a cleaning process of the surface.

As utilized herein, "and/or" means any one or more of the items in the list joined by "and/or." As an example, "x and/or y" means any element of the three-element set {(x), (y), (x, y)}. In other words, "x and/or y" means "one or both of x and y". As another example, "x, y, and/or z" means any element of the seven-element set {(x), (y), (z), (x, y), (x, z), (y, z), (x, y, z)}. In other words, "x, y and/or z" means "one or more of x, y and z". As utilized herein, the term "exemplary" means serving as a non-limiting example, instance, or illustration. As utilized herein, the terms "e.g." and "for example" set off lists of one or more non-limiting examples, instances, or illustrations.

While the present methods and/or system have been described with reference to certain aspects of the disclosure, it will be understood by those skilled in the art that various changes may be made and equivalents may be substituted without departing from the scope of the present methods and/or systems. In addition, many modifications may be made to adapt a particular situation or material to the teachings of the present disclosure without departing from its scope. Therefore, the present methods and/or systems are not limited to any particular examples disclosed. Instead, the present methods and/or systems will include all implementations falling within the scope of the appended claims, both literally and under the doctrine of equivalents.

What are claimed:

1. A brush for cleaning a surface, comprising:
   a center core; and
   cleaning material, around the center core, comprising nodules,
   wherein a first nodule density of a first region of the cleaning material at a longitudinal center of the brush is different than a second nodule density of a second region of the cleaning material, and
   wherein the nodules at the first region form a helical pattern on the cleaning material.

2. The brush of claim 1, wherein a nodule density is smaller at a longitudinal center of the brush than at a longitudinal end of the brush.

3. The brush of claim 1, wherein the nodules in the second region form a substantially grid pattern on the cleaning material.

4. The brush of claim 1, wherein a nodule density is substantially symmetric about a longitudinal center of the brush.

5. The brush of claim 1, wherein a nodule pattern is substantially symmetric about a longitudinal center of the brush.

6. The brush of claim 1, wherein the nodules are formed as a part of the cleaning material.

7. The brush of claim 1, wherein the nodules are attached to the cleaning material with an adhesive.

8. The brush of claim 1, wherein at least one nodule has a different shape than another of the nodules.

9. The brush of claim 1, wherein the brush comprises elongated nodules at the first region.

10. The brush of claim 1, wherein a diameter of a first cross-section of the brush is greater than a diameter of a second cross-section of the brush.

11. The brush of claim 1, wherein a cross section of the brush is substantially circular.

12. The brush of claim 1, wherein the cleaning material is friction fit over the center core.

13. The brush of claim 1, wherein the cleaning material is coupled to the center core with an adhesive.

14. The brush of claim 1, wherein at least some of the nodules are placed in a pattern to move cleaning fluid toward a longitudinal end of the brush, wherein the cleaning fluid is provided to one or both of the brush and the surface at least during a cleaning process of the surface.

15. A brush for cleaning a surface, comprising:
    a center core; and
    cleaning material, about the center core, comprising nodules,
    wherein first nodules at a first region of the brush have a first shape and second nodules at a second region of the brush have a second shape, and
    wherein the nodules at the first region form a helical pattern on the cleaning material.

16. The brush of claim 15, wherein one or both of the first region and the second region comprises first nodules having the first shape and the second nodules having the second shape.

17. The brush of claim 15, wherein the first region is closer to a longitudinal center of the brush than the second region.

18. The brush of claim 15, wherein the first shape is larger than the second shape.

19. The brush of claim 15, wherein at least one of the first nodules and the second nodules are placed in a pattern to move cleaning fluid toward a longitudinal end of the brush, wherein the cleaning fluid is provided to one or both of the brush and the surface at least during a cleaning process of the surface.

20. A brush for cleaning a surface, comprising:
    a center core; and
    cleaning material, around the center core, comprising nodules,
    wherein a first nodule density of a first region of the cleaning material at a longitudinal center of the brush is different than a second nodule density of a second region of the cleaning material,
    wherein the nodules at the first region form a helical pattern on the cleaning material, and
    wherein the nodules at the second region form a non-helical pattern on the cleaning material.

* * * * *